United States Patent
Aronson et al.

(10) Patent No.: US 6,483,862 B1
(45) Date of Patent: Nov. 19, 2002

(54) SYSTEM AND METHOD FOR THE MONOLITHIC INTEGRATION OF A LIGHT EMITTING DEVICE AND A PHOTODETECTOR USING A NATIVE OXIDE SEMICONDUCTOR LAYER

(75) Inventors: Lewis B. Aronson, Los Altos, CA (US); Michael R. T. Tan, Menlo Park, CA (US); Scott W. Corzine, Sunnyvale, CA (US); Dubravko I. Babic, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/209,528

(22) Filed: Dec. 11, 1998

(51) Int. Cl.$^7$ .................................................. H01S 5/00
(52) U.S. Cl. .............................. 372/50; 372/45; 372/96
(58) Field of Search ............................... 372/50, 43, 45, 372/49, 96; 257/82, 83, 84, 258; 356/504; 136/259

(56) References Cited

U.S. PATENT DOCUMENTS

| | | | |
|---|---|---|---|
| 4,237,473 A | * 12/1980 | Chiang | 257/258 |
| 4,337,443 A | * 6/1982 | Umeda et al. | 372/49 |
| 4,367,044 A | * 1/1983 | Booth, Jr. et al. | 356/504 |
| 4,760,578 A | * 7/1988 | Oshima et al. | 372/45 |
| 5,258,991 A | * 11/1993 | Peterson | 372/50 |
| 5,453,135 A | * 9/1995 | Nakagawa et al. | 136/259 |
| 5,491,712 A | * 2/1996 | Lin et al. | 372/50 |
| 5,535,231 A | * 7/1996 | Lee et al. | 372/50 |
| 5,577,064 A | * 11/1996 | Swirhun et al. | 372/96 |
| 5,751,757 A | * 5/1998 | Jiang et al. | 372/50 |

FOREIGN PATENT DOCUMENTS

| | | | |
|---|---|---|---|
| EP | 0899836 | 3/1999 | H01S/3/025 |
| JP | 62205684 | 9/1987 | H01S/3/18 |
| JP | 62-205684 | * 9/1987 | 372/43 |
| JP | 06037300 | 2/1994 | H01L/27/15 |
| WO | WO 95/26051 | 9/1995 | H01L/31/14 |
| WO | WO 99/43056 | 8/1999 | H01S/3/025 |

OTHER PUBLICATIONS

Casey, Jr. et al., Heterostructure Lasers Part A: Fundamental Principles, New York: Academic Press, 1978, p. 45. (No month available).*

Lott, J. A., "Design of Vertical Cavity Lasers with Intracavity Photodetectors", Elestronics Letters, May 22, 1997, vol. 33, No. 11, pp. 955–957.

* cited by examiner

Primary Examiner—Quyen Leung

(57) ABSTRACT

A light emitting device and photodetector combination having a structure in which the layer of the photodetector that contacts the light emitting device is separated from the light emitting device by a native semiconductor oxide layer that is both insulating and has a refractive index lower than that of the light emitting device and the photodetector. This configuration results in a light emitting device and photodetector structure that minimizes the capture of the spontaneous emission light output from the light emitting device by the photodetector while electrically isolating the light emitting device from the photodetector. The electrical isolation of the light emitting device from the photodetector results in a four terminal device in which the light emitting device and photodetector may be independently biased, and can therefore be operated at a very low bias voltage.

7 Claims, 7 Drawing Sheets

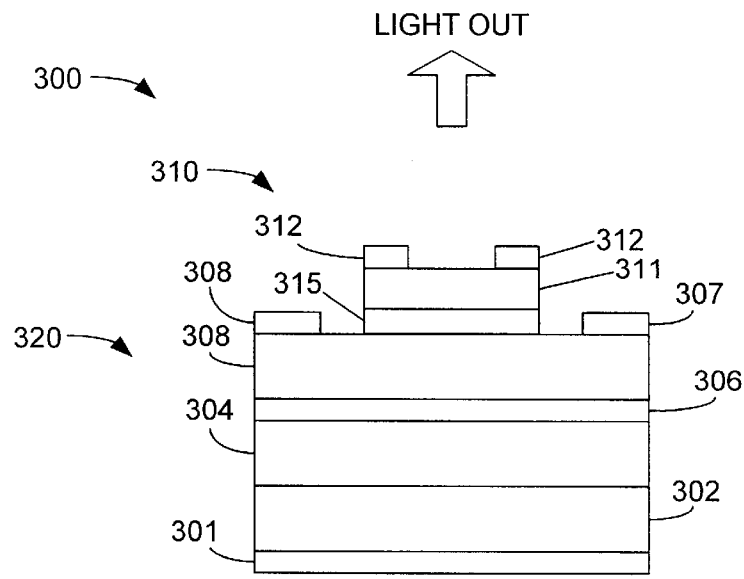
Fig. 4A
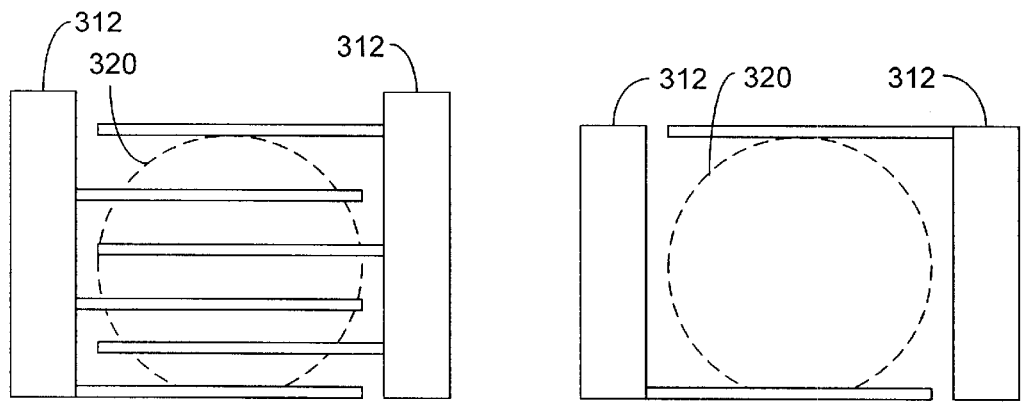
Fig. 4B  Fig. 4C

SYSTEM AND METHOD FOR THE MONOLITHIC INTEGRATION OF A LIGHT EMITTING DEVICE AND A PHOTODETECTOR USING A NATIVE OXIDE SEMICONDUCTOR LAYER

BACKGROUND OF THE INVENTION

1. Field of the Invention

The present invention relates generally to light emitting devices, and, more particularly, to a system and method for the monolithic integration of a light emitting device and a photodetector that uses a native oxide semiconductor layer to realize low spontaneous emission capture and low bias voltage operation.

2. Related Art

Semiconductor lasers in general and vertical cavity surface emitting lasers (VCSELs) in particular are used for many applications including electronics, communication systems, and computer systems. Lasers produce light that can be transmitted directionally. In many applications of lasers, and particularly in many VCSEL applications, there is a need to precisely control the laser output power. The output power of semiconductor lasers is primarily determined by the bias current. However, it can be significantly altered by the ambient temperature and aging of the device. For this reason, control of the output power is realized by monitoring the laser output and adjusting the laser current to maintain a specified laser output power. The light measurement is typically performed using a semiconductor photodetector, while the feedback loop is realized using an external electronic circuit. There are numerous implementations of such laserphotodetector systems, and they differ in application and performance.

The two primary design issues relating to the laser-photodetector system are the cost of the device and the ability to provide performance required for a specific application. From a cost perspective, it is desirable to build the laser and the photodetector on the same chip using the same or similar fabrication technology. This is realized by monolithic integration of the laser and the photodetector. Monolithic integration implies that the individual laser and photodetector devices are completed jointly at the wafer level. From a performance perspective, there are a number of desired qualities.

An important issue for efficient laser output power adjustment is the tracking between the detector current and the laser directional output power. There is no way to distinguish between the fraction of the detector current generated by the directional laser output and the fraction generated by spontaneous emission. Since the external feedback circuit requires information relating to the directional laser output power, the fraction of the detector current generated by spontaneous emission can be a source of error. This error can be minimized by minimizing the spontaneous emission captured by the detector. In addition, for efficient operation of the external feedback loop, the tracking between the directional laser output power and the photodetector current should be stable and repeatable.

Another important issue is the electrical interaction between the photodetector and the laser. The existence of the photodetector and its biasing should have a negligible effect on the operation of, and in particular, the modulation properties of the laser. The laser modulation and biasing should also have a negligible effect on the operation of the photodetector. This implies that the laser and the photodetector should be electrically de-coupled and exhibit negligible high frequency cross-talk.

Lastly, the incorporation of the laser-photodetector device into the external driver circuit should be considered. In computer communications applications the minimum bias voltage is an issue of increasing importance due to the desirability of reduced computer power consumption. Today's computer architectures are using 3.3 volt (V) power supplies having a lower limit of approximately 3.1 V. In the future and for other applications, it is foreseeable that the power dissipation will be reduced even further requiring even lower bias voltage levels.

A preferable configuration of the laser-photodetector system is one in which the laser and photodetector are independently biased from the same power supply. In order to achieve this result, the power supply voltage must be larger than the laser operating voltage, which depends on the photon energy, and the photodetector operating voltage, which depends upon the photodetector reverse bias required for efficient performance. For optical communications, the vertical cavity laser voltages range between approximately one to two volts, while the typical photodetector reverse bias voltage is between 0.5 and 1 volt. For other applications these voltages may vary.

In order to use the lowest power supply voltage possible an integrated laser and photodetector configuration enables forward biasing the laser and reverse biasing the photodetector from the same power supply. This is always achievable by using a four terminal device structure in which the laser and the photodetector can be independently biased with arbitrary polarity. If the structure permits, two of the four terminals can also be jointly connected to one power supply thereby creating a three terminal device in which the same power supply simultaneously forward-biases the laser and reverse-biases the photodetector. The realization of three terminal devices that allow this preferred biasing scheme is not always possible due to fabrication and structural limitations.

In the past, photodetectors have been integrated with lasers to varying degrees of success. For example, some integration schemes use a photodetector and laser that have been independently fabricated on different chips. The two devices are integrated at the packaging stage, after fabrication, resulting in arbitrary relative polarity between the laser and photodetector. This integration scheme is referred to as "hybrid integration". The primary disadvantage of this approach is that the extra processing step of integrating the photodetector with the laser after fabrication undesirably adds manufacturing cost. Additionally, in many cases the relationship between the photodetector current and the laser output is neither stable nor repeatable, due to the fluctuation in the laser output beam shape.

Another scheme involves monolithic integration of a photodetector and laser where the coupling is realized using side emission, resulting in both three or four terminal devices. The main disadvantage of such devices is that the photodetector does not detect the directional laser output, but predominately captures the omni-directional spontaneous emission.

Finally, another scheme involves the monolithic integration of a laser and a photodetector where the coupling is realized by top (or bottom) emission, resulting in both three and four terminal devices.

All of the implementations result in either three terminal devices where the laser and the photodetector share a common n-side (cathode) or a common p-side (anode), which requires a relatively high bias voltage for operation and in which the laser and the photodiode are electrically coupled; or in four terminal devices in which the photodetector captures a high proportion of spontaneous emission (SE) from the laser. Therefore, a monolithically-integrated laser and photodetector device that can operate at a low bias voltage, enables electrical de-coupling between the laser and the photodetector, and which minimizes the capture by the photodetector of omni-directional spontaneous emission from the laser is desired.

FIG. 1A shows a prior art laser and photodetector combination in a three terminal configuration in which an unacceptably high level of spontaneous emission is allowed to reach and be detected by the photodetector. Laser and photodetector 11 is essentially comprised of photodetector 12 deposited over laser 13 in a common cathode arrangement. The common cathode configuration is also referred to as PNP configuration because the semiconductor conductivity type changes twice in the structure. Laser 13 is typically a vertical cavity surface emitting laser (VCSEL). This arrangement is illustratively characterized as having two pn junctions. The first pn junction is active layer 14 located within laser 13 and the second pn junction is the absorbing layer 16 within photodetector 12. The laser 13 comprises a p-type substrate 22 on the bottom of which a p-type contact layer 21 is deposited. Over the substrate 22 is p-type mirror 23. Active region 14, which includes an n-type material and a p-type material separated by a light generating medium is grown over p-type mirror 23. Over active region 14 is n-type mirror 24, over which is grown n-type contact material 26.

Immediately upon n-type mirror 24 is n-type layer 31 of photodetector 12, over which absorbing layer 16 and p-type layer 32 are grown. Layers 32, 16, and 31 comprise a photodetector in a pin configuration. Over the p-type material 32 is p-type contact material 33.

In a typical VCSEL there are two components to the optical power within the structure. Below the lasing threshold, the light output consists of spontaneous emission which increases with the bias current. Spontaneous emission is spectrally broadband and generally omni-directional. At threshold and at bias currents above threshold, the spontaneous emission intensity saturates and the lasing modes appear and quickly dominate the light output. Both the wavelength emission spectrum and the angular distribution of the lasing modes are generally much narrower than those of the spontaneous emission. Because the spontaneous emission has such a wide angular distribution, a large fraction of that light never leaves the device because it is totally internally reflected at the large refractive index discontinuity between the top semiconductor layer and air, or at the semiconductor to air interface at the bottom surface of the device.

The light at large angles of incidence is totally reflected because the refractive index of the medium from which the light is incident, in this case semiconductor, is larger than the surrounding medium, in this example air. The lasing modes, on the other hand, are more directional, having components that are at most at a small angle with respect to the surface normal and are thus largely transmitted through the semiconductor to air interface.

Still referring to FIG. 1A an integrated photodetector 12 will capture the large angle spontaneous emission rays because there is no layer with a large refractive index difference between the VCSEL 13 and the photodetector 12 that would produce a total internal reflection of the spontaneous emission from the laser incident at large angles. For this reason the detector absorbs a large fraction of the omni-directional spontaneous emission in addition to absorbing the directional lasing modes.

FIG. 1B is a graphical representation 41 of the prior art laser and photodetector of FIG. 1A including example VCSEL light output and photodetector monitor current associated therewith. The horizontal axis of graph 41 indicates laser drive current and the vertical axis indicates VCSEL light output represented by line 44, and monitor photodetector current output represented by line 42. As can be seen the VCSEL directional light output below lasing threshold 51 as illustrated by portion 48 of line 44 is quite low. The directional laser output here is the light intensity that would be measured if the light was coupled into an optical fiber or measured using a detector external to the laser.

In contrast thereto, the monitor photodetector current output, which should be an indicator of detected output from the laser, shows significant response due to captured spontaneous emission below lasing threshold 51. This is illustrated by portion 47 of line 42. Because the measured monitor photodiode current does not exactly correspond to the laser output intensity, this condition is very undesirable. It is difficult for the integrated detector, and hence the external feedback circuit which measures the detector current, to resolve what fraction of the detected light is attributable to the directional laser output rather than to spontaneous emission. Therefore, high spontaneous emission capture by the integrated monitor photodiode degrades the ability of the external feedback circuit to effectively adjust the directional laser output power. The adjustment of the target directional output power cannot be performed efficiently unless the spontaneous capture is negligible when compared to the directional output power.

FIG. 1C is a schematic view illustrating exemplary driver circuitry associated with the prior art laser and photodetector of FIG. 1A. Driver 61 is represented with an NPN bipolar transistor, while the photodetector (PD) current amplifier is represented as current mirror 62 using NPN bipolar transistors 64 and 66. The actual circuit may vary with the essential elements represented herein as an example. The integrated VCSEL and photodetector device 11 is shown in a common cathode configuration, also referred to as a PNP configuration. There are several disadvantages to this structure. First, with typical operating voltages of 2 V on the VCSEL, represented by $V_L$ 67, 0.5V on the PD, represented by $V_{PD}$ 68, and 0.8 V on the bipolar transistor 61, there is insufficient bias headroom to use a power supply with a 3.1 V minimum voltage. This condition could be resolved were the VCSEL and PD electrically de-coupled, which would enable the same power supply to simultaneously forward bias the VCSEL and reverse bias the PD.

Second, in this structure the modulation and biasing of the VCSEL must be done from terminal 69 between the VCSEL and the PD. Terminal 69 is the terminal to which the collector of transistor 61 is connected. This arrangement implies that the parasitic capacitance of the PD loads the VCSEL driver 61, and that the adjustment of the VCSEL operating point inadvertently changes the operating point of the PD. Hence, the common cathode, or common anode, configuration, which uses the same power supply to simultaneously forward bias the laser and reverse bias the photodetector prevents electrical de-coupling of the VCSEL and the PD.

Thus, an unaddressed need exists in the industry for a monolithically integrated light emitting device and photodetector arrangement that operates using a low bias voltage, that provides electrical de-coupling between the light emitting device and the photodetector, and that minimizes the amount of spontaneous emission detected by the photodetector.

SUMMARY OF THE INVENTION

The invention provides a light emitting device and photodetector in a monolithically-integrated structure which enables operating bias voltages that are lower than previously achievable, that provides electrical de-coupling between the light emitting device and the photodetector, and that minimizes the amount of spontaneous emission detected by the photodetector. Although not limited to these particular applications, the system and method of the present invention are particularly suited for monolithically integrating a photodetector and a vertical cavity surface emitting laser (VCSEL) in a novel configuration that minimizes the transmission of omni-directional spontaneous light emission from a laser to a photodetector. The system and method for the monolithic integration of a light emitting device and photodetector using a native oxide semiconductor layer can be implemented using a variety of epitaxially grown semiconductor materials having various electrical properties. For example, the material layers to be described hereafter in a preferred and several alternative embodiments can be of either n-type or p-type material without departing from the concepts of the invention.

In architecture, the present invention can be conceptualized as a system for measuring the output of a light emitting device comprising a light emitting device having a light emitting device refractive index optically coupled to a photodetector having a photodetector refractive index. Moreover, a continuous insulating layer having a refractive index lower than that of both the light emitting device refractive index and the photodetector refractive index contacts the light emitting device and the photodetector.

In an alternative embodiment of the monolithically integrated light emitting device and photodetector, a Schottky photodetector is incorporated into the structure.

In another alternative embodiment of the monolithically integrated light emitting device and photodetector, a metal semiconductor metal Schottky photodetector is incorporated into the structure.

In yet another embodiment of the monolithically integrated light emitting device and photodetector, the photodetector and the continuous insulating layer are formed within one of the mirrors of the light emitting device.

The present invention may also be conceptualized as providing a method for constructing a monolithically integrated light emitting device and photodetector comprising the following steps.

A light emitting device having a light emitting device refractive index is formed. A photodetector having a photodetector refractive index is incorporated with the light emitting device. A continuous insulating layer having a refractive index lower than that of both the light emitting device refractive index and the photodetector refractive index is located at a junction of the light emitting device and the photodetector.

The invention has numerous advantages, a few of which are delineated, hereafter, as merely examples.

An advantage of the invention is that it allows a photodetector to track the directional light output from a light emitting device, while minimizing the capture of omnidirectional spontaneous emission from the light emitting device.

Another advantage of the invention is that the photodetector and the light emitting device are electrically de-coupled, thereby enabling independent biasing of the light emitting device and the photodetector, and eliminating the unnecessary loading of the light emitting device driver circuit by the photodetector parasitic capacitance. This arrangement improves the high-frequency response of the device.

Another advantage of the present invention is that it lends itself to simple integration into arrays of devices in which each detector and light emitting device may be individually biased in a straightforward manner. This arrangement allows the integration of a photodetector on arrays of VCSELs fabricated on a common conductive substrate due to the laser and photodetector being electrically isolated.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

FIG. 4A is a cross-sectional view of a second alternative embodiment of the laser and photodetector of FIG. 2A;

FIGS. 4B and 4C are schematic representations of the electrode pattern of the laser and photodetector of FIG. 4A.

DETAILED DESCRIPTION OF THE PREFERRED EMBODIMENT

The present invention is typically implemented by growing epitaxial material layers having various electrical properties and can be implemented using a variety of substrate and epitaxial growth materials. Furthermore, while described in the context of a vertical cavity surface emitting laser (VCSEL) having a monolithically integrated photodetector, the present invention is applicable to other light emitting structures, for example but not limited to, light emitting diodes (LEDs). Also, the current and optical mode confinement in the VCSEL may be accomplished by lateral oxidation, insulating implantation, or other suitable techniques that are known in the art.

Figure 2A:
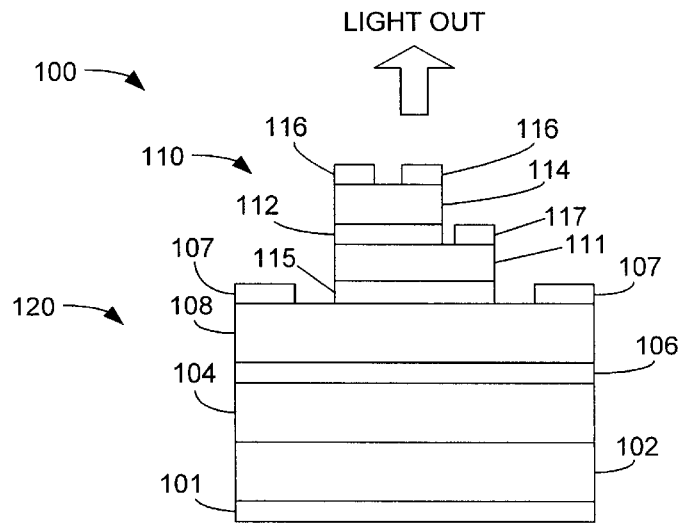
FIG. 2A is a cross-sectional view of a laser and photodetector constructed in accordance with the present invention.

Turning now to FIG. 2A, shown is a cross-sectional view of a laser and photodetector assembly 100 constructed in accordance with the present invention. In this preferred embodiment, the photodetector 110 resides over the VCSEL 120.

The foundation of the laser structure 120 is formed with an n-type substrate layer 102, on the bottom of which an n-type contact layer 101 is deposited. N-type bottom mirror 104 is grown over substrate layer 102 and has active region 106 grown thereupon. It should be noted that while illustrated herein as a single layer, the mirror layers referred to herein are typically comprised of multiple layers of material and are also referred to as "distributed Bragg reflectors" or "mirrors".

Active region 106 includes n-type material and p-type material surrounding a light amplifying medium. A pn junction is a junction between two layers of different semiconductor conductivity type. The junction may contain any number of low doped or undoped layers, and any number of different materials forming quantum wells or bulk semiconductor layers. The function of the intermediate layers in the active region 106 is to generate and amplify light traversing the junction.

Upon active region 106 is grown p-type top mirror 108, and p-type contact material 107. Upon p-type top mirror 108 is grown a lateral layer of aluminum gallium arsenide (AlGaAs) 115. The AlGaAs alloy constituting layer 115 typically has a very small (several percent), or no gallium content. This type of high aluminum containing layer can be oxidized by exposing the layer to steam at elevated temperatures in the range of 400–600° C. The epitaxially grown AlGaAs layer 115 is converted to an insulating oxide layer 115 comprising aluminum gallium oxide by oxidation in steam, as known to those skilled in the art. Since the gallium content of this alloy was small to begin with, the created oxide is typically referred to as aluminum oxide and denoted by AlOx, where the oxide composition x and the stochiometry depends on the oxidation process and the starting alloy composition. Growing the AlGaAs layer 115 epitaxially and then converting the layer into an oxide layer AlOx allows the entire device structure, including the laser 120, the photodetector 110 and the AlGaAs layer 115 to be grown in a single epitaxial step, after which the AlGaAs layer 115 is converted to an AlOx layer. This process of growing the insulation layer and then converting it to an insulating oxide layer gives rise to the term "native" oxide layer. The insulating oxide layer is said to be native because it is created by oxidizing the host semiconductor rather than being deposited by some other means.

The AlOx layer is a dielectric material having a refractive index lower than that of the surrounding semiconductor. The refractive index of the AlOx layer is approximately 1.6, while the refractive index range of semiconductor materials is typically between 2.9 and 3.5 It should be understood that the laser and photodetector refractive index are representative values of the refractive indices of the semiconductor materials that constitute the devices, and are typically average values. The AlOx layer, being insulating and having a refractive index lower than that of the laser 110 and the photodetector 120, serves two purposes. First, it electrically isolates the photodetector 110 from the laser 120, resulting in a four terminal device that enables independent biasing of the laser and the photodetector. Secondly, the low refractive index of insulating layer 115 results in the total internal reflection of a large proportion of the spontaneous emission from the underlying laser 120. This arrangement limits the light reaching the photodetector 110 predominately to the desired lasing modes.

Upon insulating oxide layer 115 is grown the bottom transparent n-type material layer 111 of the photodetector 110. Another pn junction of pin type is formed by the n-type bottom transparent layer 111, absorbing layer 112, and a transparent p-type top layer 114 grown over absorbing layer 112. Upon p-type top layer 114 is deposited p-type contact material layer 116 approximately as shown and upon n-type bottom transparent layer 111 is grown n-type contact material layer 117. The pin junction type is characterized by any number of low doped or undoped layers, or any number of different materials forming quantum wells or bulk semiconductor layers residing between one p-type and one n-type layer. The function of the intermediate layers in a pin junction of photodetector 110 is to partially absorb light traversing the junction.

There are three important considerations that determine the thickness of insulating oxide layer 115. First, the insulating oxide layer 115 should be thick enough to prevent coupling of large angle spontaneous emission rays through the layer. This condition is known as frustrated total internal reflection and will generally require that the insulating oxide layer 115 be at least 1000 Å angstroms (Å) in thickness. Second, it is sometimes desirable to either maximize or minimize the reflection of the laser mode (using the insulating oxide layer. This can be accomplished by making the insulating oxide layer thickness equal to one quarter or one half of the laser emission wavelength. For example, in the case of an 850 nanometer (nm) emission and assuming a refractive index of 1.6, the required insulating oxide layer thickness is about 1300 Å or 2600 Å respectively. Finally, the thickness of the insulating oxide layer will, along with the area of the photodiode, determine the capacitive coupling between the devices. For example, for a detector with a 20 micrometer diameter and a 1000 Å thick AlOx layer the parasitic capacitance is in the region of 0.07 picofarads (pF).

The arrow above laser and photodetector assembly 100 indicates the light output of this preferred embodiment. It should be noted that the material layers can be reversed (i.e., all n-type layers replaced with p-type layers and all p-type layers replaced with n-type layers). The transparent layers in the photodetector may be partially absorbing. In addition, the semiconductor conductivity type of the top and bottom transparent layers may also be interchanged, depending upon the application, to yield a p-type bottom transparent layer and a top n-type layer, without departing from the concept of the invention.

Since the output light can be taken from either the top or the bottom of the laser, the detector may be placed on either side of the laser without departing from the concept of the invention. If the detector is placed in the path of the laser output beam, then the absorbing layer 112 may be designed to absorb only a fraction of the laser output power while the rest of the light is emitted from the device. If, on the other hand, the detector is placed on the opposite side of the laser output mirror, then the detector absorbing layer may be designed to absorb all of the light that traverses the detector. The latter structure is not shown, but it will be clear to those skilled in the art that the location of the detector and the mirror through which the light is taken or absorbed can be arbitrarily varied without departing from the basic concept of the invention.

Figure 2B:
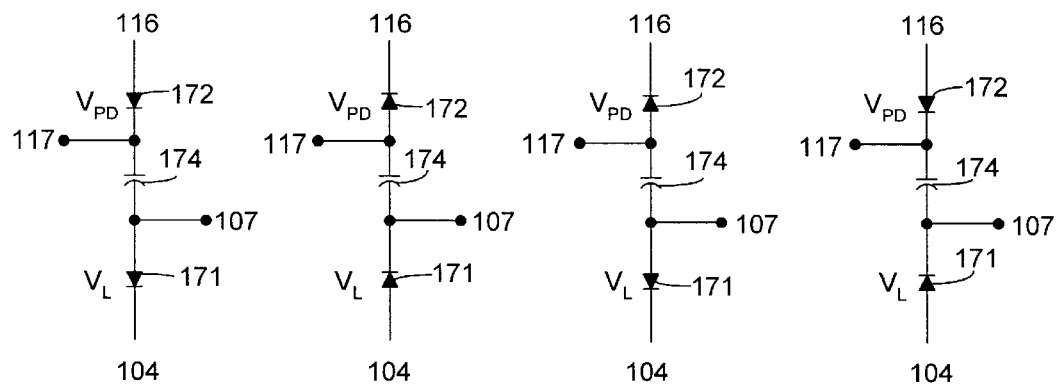
FIG. 2B is a schematic view illustrating the equivalent circuit diagram of the laser and photodetector of FIG. 2A.

FIG. 2B is a schematic view illustrating the equivalent circuit diagram of the laser and photodetector of FIG. 2A. Illustrated are four possible polarity orientations of a laser, represented by $V_L$ 171, and a photodetector, represented by $V_{PD}$ 172. The capacitor 174 appearing between the laser 171 and the photodetector 172 originates from the insulating native oxide layer, 115 of FIG. 2A, and electrically de-couples the laser, 120 of FIG. 2A, and photodetector, 110 of FIG. 2A. The bottom terminal in all of the circuit variations represents a contact to the VCSEL bottom mirror 104 of FIG. 2A, through substrate contact 101 of FIG. 2A. The top VCSEL terminal (107 of FIG. 2A), the bottom transparent layer of the PD. terminal (117 of FIG. 2A), and top transparent layer of the PD terminal (116 of FIG. 2A) are the surface terminals of device 100 of FIG. 2A. It should be evident that any possible biasing combination may be realized using the four terminal monolithically integrated laser and photodetector device 100. Furthermore, it is possible to jointly connect any two of the three top surface terminals (107, 116, 117) to a power supply or ground. The connection between any of the surface terminals may be realized using metalization traces on the devices. In this manner a monolithically integrated three terminal device can be created, which among other features, enables forward bias on the VCSEL and reverse bias on the PD.

It should be evident that the n-type contact to the active layer 106 may be realized using a contact deposited directly on the n-type mirror layer 104 at a location distanced laterally from the p-type contact 107, rather than through the substrate 102, without departing from the concept of the invention. In this manner, substrate contact 101 is replaced by a surface contact, thereby adapting the device to surface biasing, such as may be desired in monolithically integrated laser and photodetector array applications. In this manner a four terminal surface contacted device may be constructed.

In addition, a three terminal device may be realized by allowing the AlOx layer to be continuous only below the photodetector, but not oxidizing the AlGaAs layer 115 in other regions where an electrical contact between the top VCSEL layer 108 and the bottom transparent layer 111 of the photodetector may be realized. This is done in order to prevent the capture of spontaneous emission by the photodetector. The junction formed by p-type top mirror 108, unoxidized layer 115 and n-type bottom transparent layer 111, may or may not constitute a pn junction, depending upon the semiconductor conductivity type of the layers.

Contact layer 101, which contacts n-type bottom mirror 102, p-type contact layer 107, which contacts p-type top mirror 108, n-type contact layer 117, which contacts n-type bottom transparent layer 111, and p-type contact layer 116, which contacts the top transparent p-type material layer 114 of photodetector 110, form four contacts. These four contacts enable the laser and photodetector to be independently biased, resulting in a device structure in which the laser and photodetector are electrically decoupled, thereby enabling independent biasing of the laser and the photodetector. In addition, the de-coupling of the photodetector and the laser by the introduction of a low capacitance isolation layer dramatically reduces the unnecessary loading of the laser driver circuit by the photodetector parasitic capacitance, thereby improving the high-frequency response of the device.

Figure 2C:
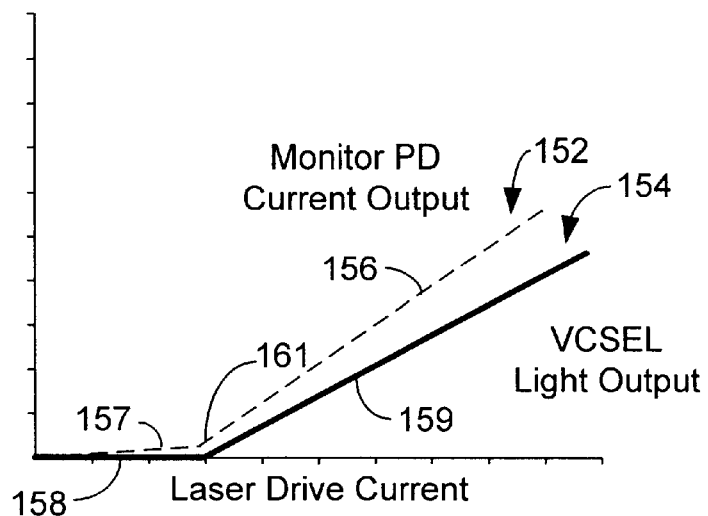
FIG. 2C is a graphical representation of the laser and photodetector of FIG. 2A including exemplary VCSEL light output and photodetector monitor current associated therewith.

FIG. 2C is a graphical representation 150 of the laser and photodetector of FIG. 2A including exemplary VCSEL light output and photodetector monitor current associated therewith, which will be used to illustrate the effect of the native oxide insulating layer of a preferred embodiment of the invention.

Figure 1A:
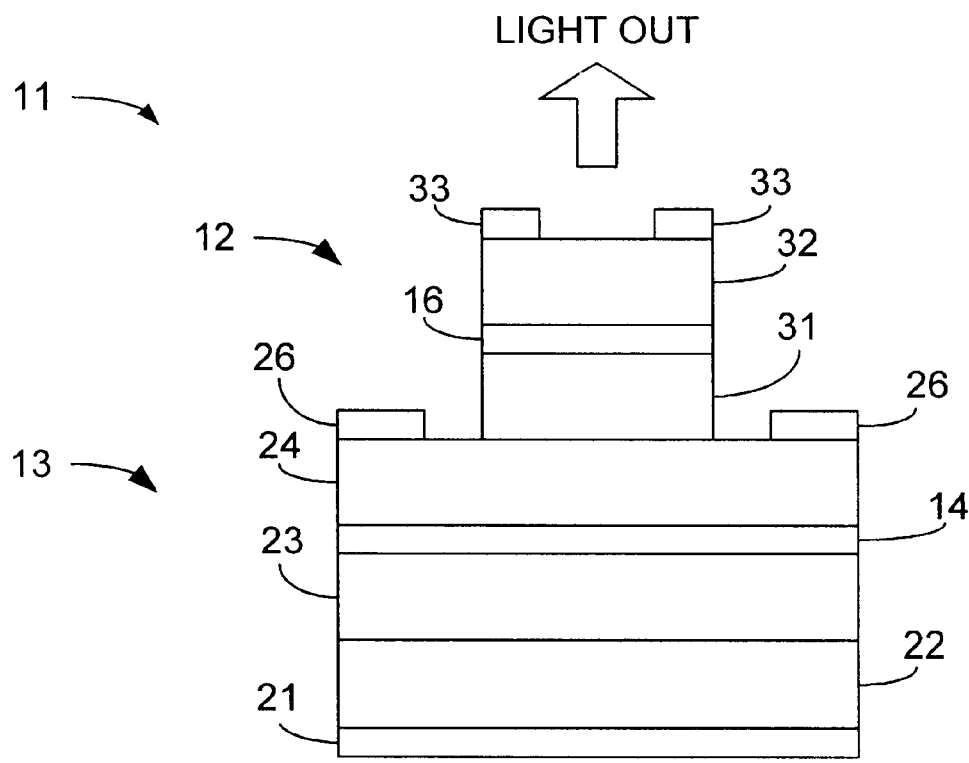
FIG. 1A is a cross-sectional view of a prior art laser and photodetector.
Figure 1B:
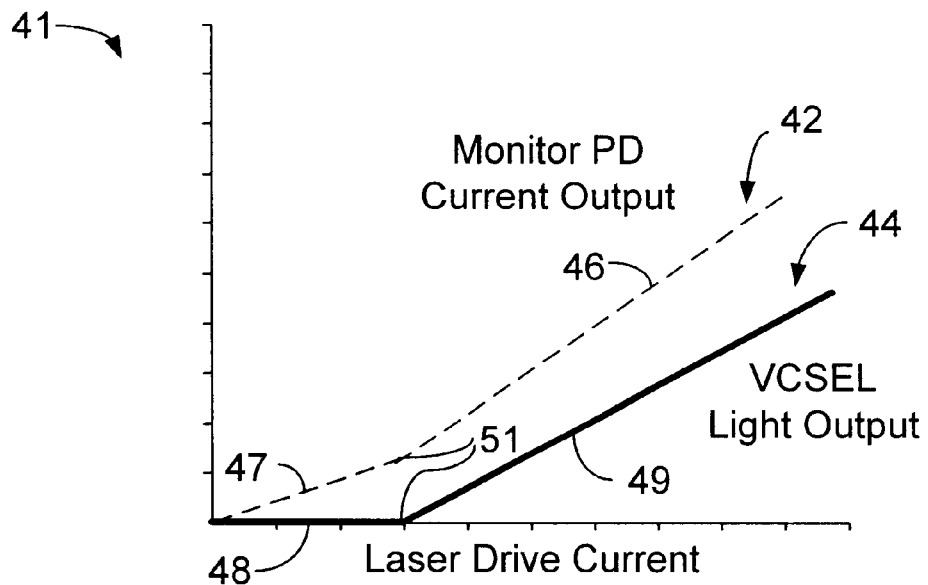
FIG. 1B is a graphical representation of the prior art laser and photodetector of FIG. 1A including example VCSEL light output and photodetector monitor current associated therewith.

The horizontal axis of graph 150 indicates laser drive current and the vertical axis indicates VCSEL light output represented by line 154 and monitor photodetector current output represented by line 152. The VCSEL directional light output below lasing threshold 161 as illustrated by portion 158 of line 154 is typically very low. Due to the incorporation of insulating native oxide layer 115 (FIG. 2A), the monitor photodetector current output, which is an indicator of detected output from the laser, shows significantly reduced response (indicated by portion 157 of line 152) with respect to the prior art shown in FIG. 1B. This indicates a high degree of reduction of spontaneous emission capture from laser 120 (FIG. 2A) below lasing threshold 161. This condition illustrates that the incorporation of insulating native oxide layer 115 (FIG. 2A) with a low refractive index between laser 120 and photodetector 110 significantly reduces the amount of omni-directional spontaneous emission transmitted from laser 120 to photodetector 110.

Figure 1C:
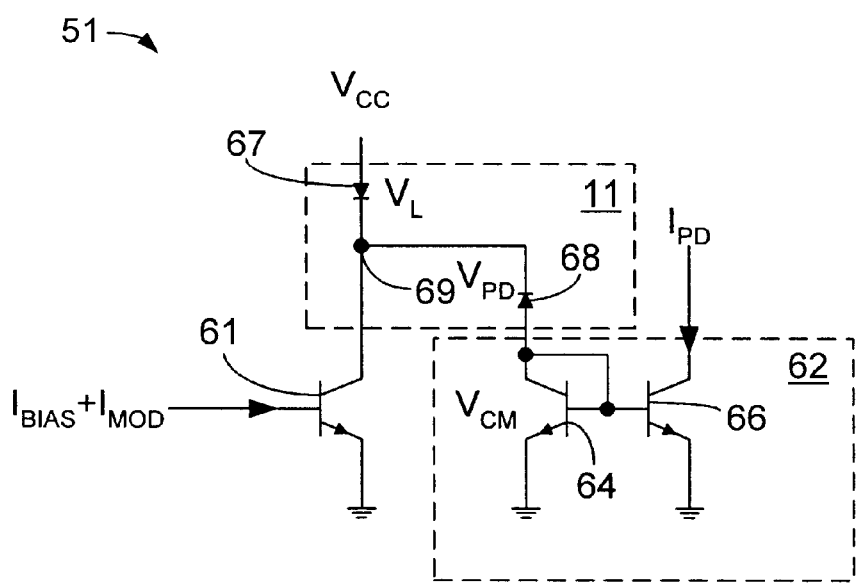
FIG. 1C is a schematic view illustrating exemplary driver circuitry associated with the prior art laser and photodetector of FIG. 1A.
Figure 2D:
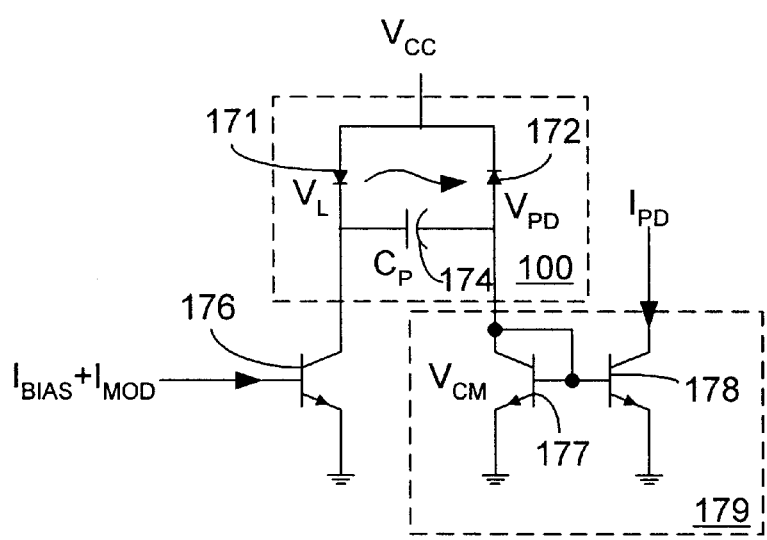
FIG. 2D is a schematic view illustrating exemplary driver circuitry of the laser and photodetector of FIG. 2A.

FIG. 2D is a schematic view illustrating exemplary driver circuitry of the laser and photodetector of FIG. 2A. Driver 176 is represented by an NPN biopolar transistor, while the photodetector current amplifier is represented as a current mirror circuit 179 using two NPN bipolar transistors 177 and 178. The actual circuit may vary with the essential elements represented herein as an example. The integrated VCSEL and photodetector device 100 is shown as a four terminal device. This arrangement provides biasing advantages over the device illustrated in FIGS. 1A and 1C. First, the same power supply forward-biases the VCSEL, represented by $V_L$ 171, and reverse-biases the PD, represented by $V_{PD}$ 172, allowing the maximum bias headroom for each device. This arrangement makes it possible to bias the device with a 3.1 V power supply.

Second, in this structure the biasing of the VCSEL 171 has no electrical interaction with the PD 172. As illustrated in FIG. 2B, there are four possible ways of orienting the polarity of the integrated VCSEL and PD. In some situations the VCSEL driver may be loaded by the parasitic capacitance $C_p$ 174 introduced by the insulating native oxide layer 115. However, because of the small size of the photodetector and the ability to make the insulating native oxide layer 115 thicker, this capacitance may be designed to have a value that does not limit the frequency response of the laser.

The following two alternative embodiments of the monolithically integrated laser and photodetector having an insulating native oxide layer are based on replacing the pin photodetector shown in FIG. 2A, with a Schottky detector in the first alternative embodiment, and a metal-semiconductor-metal detector in the second alternative embodiment.

Figure 3:
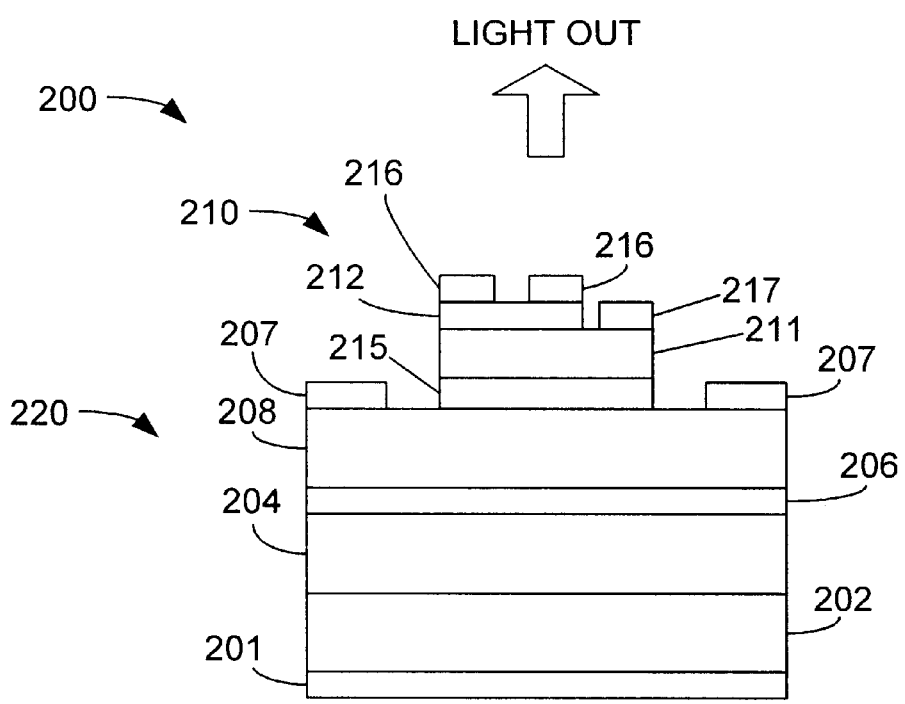
FIG. 3 is a cross-sectional view of a first alternative embodiment of the laser and photodetector of FIG. 2A.

FIG. 3 is a cross-sectional view of a first alternative embodiment 200 of the laser and photodetector 100 of FIG. 2A. The foundation of the laser structure 220 comprising layers 202–208 and contacts 201 and 207 is formed in similar fashion to the laser structure 120 comprising layers 102–108 and contacts 101 and 107 of FIG. 2A. Upon the laser structure is grown a layer of aluminum gallium arsenide (AlGaAs) 215, which is converted to AlOx by oxidation in steam, in the manner described hereinabove. The pin photodetector of FIG. 2A comprising layers 111, 112, 114, and contacts 116 and 117, is replaced with a Schottky contact comprising n-type bottom transparent layer 211 over which is deposited n-type contact material layer 217. Contact 217 is deposited on an end of n-type transparent layer 211. On top of n-type transparent layer 211 a transparent layer of indium tin oxide (ITO) 212 is grown. The ITO layer 212 creates a Schottky contact to the n-type layer 211. Over the ITO layer 212 is deposited metal contact material 216.

The arrow above laser and photodetector assembly 200 indicates the light output of this preferred embodiment. It should be noted that the material layers can be reversed (i.e., all n-type layers replaced with p-type layers and all p-type layers replaced with n-type layers).

Contact layer 201, which contacts n-type bottom mirror 202, p-type contact layer 207, which contacts p-type top mirror 208, n-type contact layer 217, which contacts n-type bottom transparent layer 211, and metal contact layer 216, which contacts the indium tin oxide (ITO) transparent Schottky layer 212 of photodetector 210, form four contacts. All of the advantages described with respect to the preferred embodiment apply to this alternative embodiment.

FIG. 4A is a cross-sectional view of a second alternative embodiment 300 of the laser and photodetector of FIG. 2A. The foundation of the laser structure 320 comprising layers 302–308 and contacts 301 and 307 is formed in similar fashion to the laser structure 120 comprising layers 102–108 and contacts 101 and 107 of FIG. 2A. Upon the laser structure is grown a layer of aluminum gallium arsenide (AlGaAs) 315, which is converted to AlOx by oxidation in steam, in the manner described hereinabove. The pin photodetector of FIG. 2A comprising layers 111, 112, 114, and contacts 116 and 117, is replaced with a metal-semiconductor-metal detector comprising an intrinsic semiconductor layer 311 grown over the AlGaAs layer 315, over which is applied electrode contact 312. An intrinsic semiconductor layer is one in which there is low doping, or possibly no doping, resulting in a material that is neither p-type nor n-type. Structure 310 is referred to as a metal-semiconductor-metal (MSM) detector. Metal electrodes 312 on the surface of intrinsic layer 311 form Shottky contacts to the material. Both terminals of this device are located on the upper surface of the semiconductor.

An MSM photodetector may have several advantages over other photodetectors for this type of application. First, the MSM structure is particularly easy to fabricate both in terms of the epitaxial growth as well as the subsequent device processing. Normally, MSM structures are designed to have high bandwidth (i.e., the ability to detect high frequency optical modulation), which usually dictates a dense interdigitated electrode pattern on the top surface. In the case of a monitor photodiode the bandwidth, and to some extent the responsivity requirements, are very small and a simplified, less dense electrode pattern may suffice as will be described in detail with respect to FIGS. 4B and 4C.

The arrow above laser and photodetector assembly 300 indicates the light output of this preferred embodiment. It should be noted that the material layers can be reversed (i.e., all n-type layers replaced with p-type layers and all p-type layers replaced with n-type layers).

FIGS. 4B and 4C are schematic representations of the electrode pattern of the laser and photodetector of FIG. 4A. FIG. 4B shows a typical interdigitated electrode pattern 312 relative to laser structure 320. Electrodes 312 are interdigitated in order to minimize the distance between the two electrodes of each MSM detector and to maximize the area of the detector.

FIG. 4C shows a simplified electrode pattern that is possible for monitor photodiode applications. It can be seen that the contact between electrodes 312 and laser aperture 320 is simplified, thus reducing cost and complexity.

Figure 5:
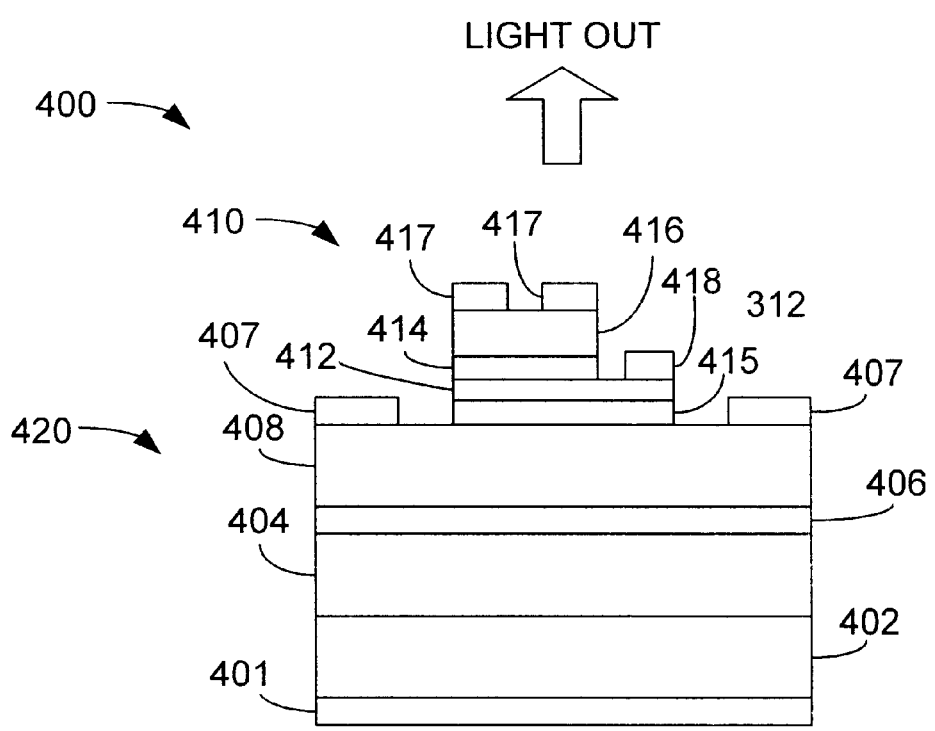
FIG. 5 is a cross-sectional view of a third alternative embodiment of the laser and photodetector of FIG. 2A.

FIG. 5 is a cross-sectional view of a third alternative embodiment of the laser and photodetector of FIG. 2A. Laser and photodetector 400 illustrates one possible combination wherein a photodetector and the insulating native oxide layer are embedded in one of the mirrors of a laser device. This arrangement can further minimize the capture of omni-directional spontaneous emission by the absorbing layer.

The laser structure 420 is formed by bottom mirror 404, active region 406, and top mirror 408 formed over substrate 402, on the bottom of which is deposited n-type contact layer 401. In the center of top mirror 408 is grown an insulating oxide layer 415, over which is placed photodetector 410. Insulating layer 415 is a native oxide insulating layer similar to layers 115, 215 and 315 described herein. Photodetector 410 includes n-type material layer 412, absorbing layer 414, n-type contact material 418, and p-type material layer 416. On top of p-type material layer 416, the p-mirror continues and terminates with p-type contact 417. Because of the lower refractive index of insulating oxide layer 415, most of the omni-directional spontaneous emission is totally internally reflected, while placing the photodetector absorbing region 414 at the peak of the standing wave pattern enhances the photodetector responsivity. The result is that the responsivity is enhanced while off-normal spontaneous emission is minimized by total internal reflection.

It will be obvious to those skilled in the art that many modifications and variations may be made to the preferred embodiments of the present invention, as set forth above, without departing substantially from the principles of the present invention. For example, the system and method for the monolithic integration of a light emitting device and photodetector using a native oxide semiconductor layer can be implemented using various semiconductor technology. Furthermore, while illustrated herein as a photodetector residing either upon or within a laser structure, the photodetector may also be grown prior to the laser, and may reside either above or below the laser structure.

In addition, while described herein as useful for monitoring the light output of a laser, the system and method for the monolithic integration of a light emitting device and photodetector using a native oxide semiconductor layer may be used to monitor incoming laser light, effectively using the device as an integrated transmitter and receiver. This is possible because the biasing and electrical de-coupling requirements on such a device are similar to that of a laser output power measuring device. All such modifications and variations are intended to be included herein within the scope of the present invention, as defined in the claims that follow.

What is claimed is:

1. A system for measuring an output of a light emitting device, comprising:

a light emitting device including a first reflector and a second reflector, said light emitting device having a light emitting device refractive index;

a photodetector optically coupled to said light emitting device, said photodetector having a photodetector refractive index; and a continuous insulating layer within said second reflector and in contact with said light emitting device and said photodetector, said continuous insulating layer having a refractive index lower than both said light emitting device refractive index and said photodetector refractive index, wherein said light emitting device, said photodetector and said continuous insulating layer are grown in a single epitaxial step.

2. The system as defined in claim 1, wherein said light emitting device is a vertical cavity surface emitting laser.

3. The system as defined in claim 1, wherein said photodetector resides in a light output path of said light emitting device.

4. The system as defined in claim 1, wherein said continuous insulating layer is a native semiconductor oxide layer.

5. The system as defined in claim 1, wherein said photodetector and said continuous insulating layer are located within said light emitting device.

6. The system as defined in claim 1, wherein said photodetector is a Schottky photodetector.

7. The system as defined in claim 1, wherein said photodetector is a metal semiconductor metal photodetector.

* * * * *